United States Patent
La Rosa et al.

(10) Patent No.: US 10,790,293 B2
(45) Date of Patent: *Sep. 29, 2020

(54) COMPACT NON-VOLATILE MEMORY DEVICE OF THE TYPE WITH CHARGE TRAPPING IN A DIELECTRIC INTERFACE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/542,511

(22) Filed: Aug. 16, 2019

(65) Prior Publication Data

US 2019/0371805 A1   Dec. 5, 2019

Related U.S. Application Data

(63) Continuation of application No. 15/810,979, filed on Nov. 13, 2017, now Pat. No. 10,438,960.

(30) Foreign Application Priority Data

Nov. 25, 2016 (FR) ..................................... 16 61500

(51) Int. Cl.
| | | |
|---|---|---|
| *H01L 27/11563* | (2017.01) | |
| *H01L 21/28* | (2006.01) | |
| *H01L 27/1157* | (2017.01) | |
| *H01L 29/423* | (2006.01) | |
| *G11C 16/04* | (2006.01) | |
| *H01L 27/11536* | (2017.01) | |

(52) U.S. Cl.
CPC .... *H01L 27/11563* (2013.01); *G11C 16/0433* (2013.01); *G11C 16/0466* (2013.01); *H01L 27/1157* (2013.01); *H01L 27/11536* (2013.01); *H01L 29/40117* (2019.08); *H01L 29/42352* (2013.01)

(58) Field of Classification Search
None
See application file for complete search history.

(56) References Cited

U.S. PATENT DOCUMENTS

| | | |
|---|---|---|
| 5,477,068 A | 12/1995 | Ozawa |
| 2006/0226474 A1 | 10/2006 | Ho et al. |

(Continued)

*Primary Examiner* — Bo B Jang
(74) *Attorney, Agent, or Firm* — Slater Matsil, LLP

(57) ABSTRACT

A memory device includes a first state transistor and a second state transistor having a common control gate. A first selection transistor is buried in the semiconductor body and coupled to the first state transistor so that current paths of the first selection transistor and first state transistor are coupled in series. A second selection transistor is buried in the semiconductor body and coupled to the second state transistor so that current paths of the second selection transistor and second state transistor are coupled in series. The first and second selection transistors have a common buried selection gate. A dielectric region is located between the common control gate and the semiconductor body. A first bit line is coupled to the first state transistor and a second bit line is coupled to the second state transistor.

20 Claims, 4 Drawing Sheets

(56) References Cited

U.S. PATENT DOCUMENTS

| | | | |
|---|---|---|---|
| 2012/0007160 A1* | 1/2012 | Kim | H01L 21/82345 257/306 |
| 2012/0086084 A1* | 4/2012 | Kikuchi | H01L 21/82384 257/369 |
| 2014/0198583 A1 | 7/2014 | Kern et al. | |
| 2015/0348640 A1 | 12/2015 | La Rosa et al. | |

* cited by examiner

COMPACT NON-VOLATILE MEMORY DEVICE OF THE TYPE WITH CHARGE TRAPPING IN A DIELECTRIC INTERFACE

CROSS-REFERENCE TO RELATED APPLICATIONS

This application is a continuation of U.S. application Ser. No. 15/810,979, filed on Nov. 13, 2017, which claims priority to French Patent Application No. 1661500, filed on Nov. 25, 2016, which application is hereby incorporated herein by reference.

TECHNICAL FIELD

Modes of implementation and embodiments of the invention relate to non-volatile memory devices, notably those of the type with charge trapping in a dielectric interface and comprising buried selection transistors.

BACKGROUND

A non-volatile memory cell may be for example of the electrically erasable and programmable (EEPROM) type or else of the type with vertical selection transistor with a state transistor with floating gate selectable by way of the selection transistor connected in series with the state transistor.

With the increase in density in memory devices, floating-gate memory cells are getting ever closer together, this possibly generating interference between the charge stored in adjacent floating gates.

Hence, it is envisaged to use another type of non-volatile memory that may be referred to by the expression "memory cell of the type with charge trapping in a dielectric interface" better known by the person skilled in the art under the acronym "SONOS" or else "MONOS", depending on the material used for the control gate.

More precisely, such a type of memory cell comprises a control gate separated from the substrate by a dielectric interface configured to trap charge.

Generally such an interface comprises a charge storage layer, for example made of silicon nitride (N), situated on a tunnel dielectric layer, for example formed of silicon dioxide (O), and under a dielectric blocking layer, for example also formed of silicon dioxide (O). The channel region of such a state transistor is for example formed in a silicon substrate (S). If the control gate is made of polysilicon (S), one then speaks of a SONOS device while if the control gate is at least partially metallic, one may speak of a device of the MONOS type.

SUMMARY

Embodiments provide non-volatile memory devices of the type with charge trapping in a dielectric interface that are particularly compact.

According to one aspect, a non-volatile memory device comprises a memory plane comprising rows and columns of memory cells. Each memory cell is of the type with charge trapping in a dielectric interface and comprises a state transistor selectable by a vertical selection transistor buried in a substrate and comprising a buried selection gate.

The columns of memory cells comprise pairs of twin memory cells, the two selection transistors of a pair of twin memory cells having a common selection gate.

The two state transistors of a pair of twin memory cells moreover have a common control gate. The device furthermore comprises, for each pair of twin memory cells, a dielectric region situated between the control gate and the substrate and overlapping the common selection gate so as to form on either side of the selection gate the two charge-trapping dielectric interfaces respectively dedicated to the two twin memory cells.

The memory device moreover comprises two bit lines per column of memory cells, and two twin adjacent memory cells of one and the same column are not linked to the same bit line while two non-twin adjacent memory cells of one and the same column are linked to the same bit line.

The memory device exhibits thus an architecture of the "dual bit line" type.

The memory device further comprises gate drive lines linked to the control gates of the state transistors of the memory cells of one and the same row.

The overlapping, by the charge-trapping dielectric region and by the control gate, of the buried selection gate common to two twin memory cells makes it possible to render the memory device more compact.

The dielectric region situated between the control gate and the substrate advantageously possesses a first dielectric layer intended to trap charge, flanked by two second dielectric layers.

When each memory cell is of the SONOS type, the control gate of each memory cell can comprise polysilicon, the first dielectric layer can comprise silicon nitride and the two second dielectric layers can comprise silicon dioxide.

Although not indispensable, it is particularly beneficial for the channel of the state transistor of each memory cell to comprise a channel implanted at the surface in the substrate and configured so that the memory cell operates in a depletion mode.

Indeed, this will make it possible for example to apply a zero voltage on the read-control gate.

Indeed, the state transistor being of the depletion type, the passing character ("normally on") of the state transistor when the memory cell is in a virgin state and when a zero voltage is applied to the control gate is related to the value of its threshold voltage in the virgin state of the memory cell which can for example be chosen to be negative or substantially zero.

Moreover, in addition to a virgin state, the memory cell can exhibit a first state, for example an erased state, corresponding to a first logical value of the stored bit and a second state, for example a programmed state, corresponding to a second logical value of the stored bit.

And the threshold voltages of the state transistor in these two states of the memory cell lie on either side of the threshold voltage of the state transistor of the memory cell in the virgin state.

Thus, for example, in the first state of the memory cell the threshold voltage of the state transistor is negative and less than the threshold voltage of the state transistor of the memory cell in the virgin state while in the second state of the memory cell, the threshold voltage of the state transistor is positive and greater than the threshold voltage of the state transistor of the memory cell in the virgin state.

It therefore becomes possible to apply a zero reading voltage on the control gate during a reading operation.

Indeed, with such a zero reading voltage, it is possible to differentiate the state of the memory cell since the state transistor of a memory cell in its first state (cell erased for example) will be passing since its threshold voltage will be less than that of a virgin cell and it will be blocked in the presence of a memory cell in its second state (cell programmed for example) since the threshold voltage will now be positive.

Moreover, since there is a zero read-voltage on the control gate, no stress is induced during the reading in the dielectric interface (read stress), thus making it possible to greatly reduce, or indeed to remove, the risk of the appearance of a phenomenon known by the person skilled in the art by the phrase "read disturb" which may be manifested as a modification of the logical value of the stored bit.

That said, the more a memory cell ages, the more the erased state of this cell approaches that of a memory cell in the virgin state.

Hence, in order to guarantee, as far as possible over time, reliable differentiation of the two states, erased and programmed, of the memory cell during its reading, a negative threshold voltage will advantageously be chosen for the state transistor of the memory cell in the virgin state.

Also, the more appreciably negative this threshold voltage, the more reliable this differentiation will be. In this regard it will be possible to choose, for the state transistor of the memory cell in the virgin state, a threshold voltage of less than or equal to −0.5 volts, for example lying between −1 volt and −0.5 volts.

The channel of the state transistor is advantageously a channel implanted at the surface in the substrate.

The depth of the implanted channel is preferentially sufficiently small for the channel to be considered as remaining at the surface. Indeed, in certain cases, notably during erasure or programming, the state transistor must be in a blocked state. And if the depth of the channel is too significant, it will then be difficult to block the state transistor.

The person skilled in the art will know how to adjust the energy of implantation of the dopants so as to obtain a depth of the channel compatible with a transistor of the depletion type while allowing easy blocking of the latter if necessary.

By way of indication, the depth of the implanted channel is advantageously less than or equal to 100 nm.

The dose of dopants controls the threshold voltage of the state transistor.

Thus, to obtain a state transistor having a negative threshold voltage in the case of a virgin cell, the implanted dose of dopants can lie between $10^{12}$ atoms/cm$^2$ and $10^{14}$ atoms/cm$^2$. A threshold voltage for a virgin cell of for example between −1 volt and −0.5 volts is then obtained.

It should moreover be noted that it is particularly advantageous to use a channel implanted at the surface in combination with a vertical selection transistor connected in series with the state transistor. Indeed, if the selection transistor exhibited a planar architecture, it might be difficult to implant the channel of the state transistor without implanting the channel of the selection transistor so as to maintain a selection transistor having a low current in the blocked state (IOFF). And even if the implantation of dopants is limited to the channel zone situated under the dielectric interface intended to trap charge, the implantation might affect the effective length of the channel of the selection transistor because of the lateral diffusion of the dopants.

And such a difficulty is not encountered with a vertical selection transistor, that is to say one whose gate extends vertically in the substrate.

With a memory plane of the "dual bit line" type and twin memory cells structure, it is possible to read a memory cell without applying a reading disabling voltage to the twin memory cell.

Therefore, the read circuit can be advantageously configured to apply a zero reading voltage on the control gates of the state transistors of all the memory cells of the memory plane.

Moreover, the memory cells of at least one part of a row can form a page and the read circuit can be configured to read the memory plane page-wise.

BRIEF DESCRIPTION OF THE DRAWINGS

Other advantages and characteristics of the invention will become apparent on examining the detailed description of wholly non-limiting modes of implementation and embodiments and the appended drawings in which.

DETAILED DESCRIPTION OF ILLUSTRATIVE EMBODIMENTS

Figure 1:
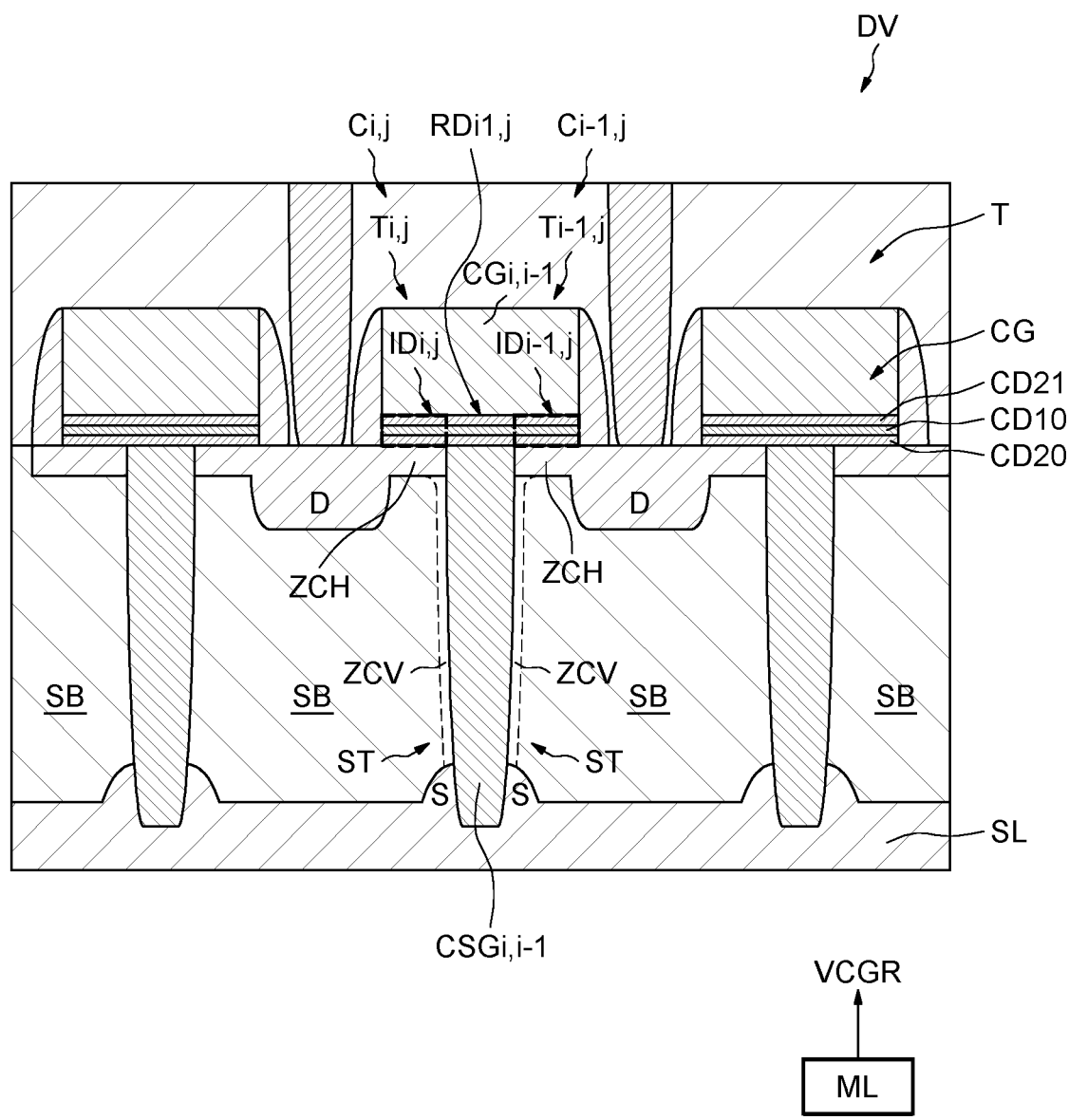
FIGS. 1 to 4 illustrate various embodiments of the invention.

Reference is made to FIG. 1 to describe the structure of memory cells of a memory plane of a memory device.

Each memory cell is here a cell with trapping of charge in a dielectric interface, of the SONOS type. Indeed, each state transistor T of a memory cell comprises a polysilicon control gate CG surmounting a dielectric interface comprising a first dielectric layer CD10 intended to trap charge, made for example of silicon nitride, flanked by two second layers CD20 and CD21, made of silicon dioxide.

The layer CD20 forms a tunnel oxide layer while the layer CD21 forms a charge blocking layer.

Moreover, this dielectric interface rests on a silicon semiconductor substrate SB.

The references Ci,j and Ci−1,j designate two twin memory cells belonging to one and the same column of the memory plane.

These two cells are termed twin cells since their associated vertical selection transistors ST comprise a common selection gate CSGi,i−1 buried in the substrate SB.

The substrate SB is here of conductivity type P and the buried source line S is of conductivity type N.

Moreover, each state transistor T possesses a drain region D of conductivity type N.

Moreover, the state transistors Ti,j and Ti−1,j of the two twin memory cells possess a common control gate CGi,i−1.

Moreover, the device comprises for each pair of twin memory cells Ci,j and Ci−1,j a dielectric region referenced RDi−1,j situated between the polysilicon common control gate CGi,i−1 and the substrate SB.

This dielectric region RDi−1,j overlaps the vertical buried common selection gate CSGi,i−1 so as to form on either side of this common selection gate the two charge-trapping dielectric interfaces IDi,j and IDi−1,j associated with these two twin memory cells Ci,j and Ci−1,j.

These dielectric interfaces each comprise a portion of the above-mentioned layers CD10, CD20 and CD21.

Moreover, there is no possible lateral transfer of charge between the two dielectric interfaces IDi−1,j and IDi,j of these two twin memory cells.

In the embodiment illustrated in FIG. 1, the channel of the state transistor comprises a channel implanted at the surface ZCH, which is N-doped, in such a way that the corresponding memory cell operates in a depletion mode.

Moreover, the reference ZCV designates that region of the substrate SB in which the vertical channel of the corresponding selection transistor ST is formed.

Having regard to the proximity of the drain region D to the selection gate, the channel zone ZCV and the implanted channel zone ZCH will form one and the same channel consequently occulting the drain region of the selection transistor ST and source region of the state transistor.

The channel ZCH must advantageously remain a surface channel so that it may be possible to be able to block the conduction of the channel by applying an acceptable control voltage on the control gate of the state transistor T.

The energy of implantation of the dopants defines the depth d of the channel. By way of indication, this energy may be between 5 keV and 100 keV, leading to a thickness d of the order of 100 nm.

In the case of a channel of conductivity type N, the implanted dopants may be for example arsenic (As), and the concentration of dopants determines the threshold voltage Vtho of the transistor T of a memory cell in the virgin state. The state transistor is here configured to have a negative threshold voltage Vtho such as this. In this regard, it is possible to use a dose of implanted dopants of between $10^{12}$ atoms/cm$^2$ and $10^{14}$ atoms/cm$^2$.

With such a dose of dopants it is possible to obtain a negative voltage Vtho of for example between −1 volt and −0.5 volts.

In read mode, read circuit ML of conventional structure are configured to apply a zero reading voltage VCGR on the control gate CG of the state transistor and to apply a positive voltage on the bit line B connected to the drain of the memory cell to be read.

The transistor T being a depletion transistor with a negative voltage Vtho, it is normally passing for a virgin memory cell, that is to say when no charge is present in the floating gate.

A state transistor of an erased memory cell will be passing while the state transistor of a programmed memory cell will be blocked. Also, the fact of applying a zero voltage VCGR on the control gate and consequently, does not induce any "read stress", thus helping to remove the risk of "read disturb".

It should be noted that for the sake of simplification of the figure, the contact making it possible to link the buried common gate CSG to the corresponding word line is not represented. The same holds for the contact pickups of the substrate SB as well as for the contact pickup of the source line SL.

Figure 2:
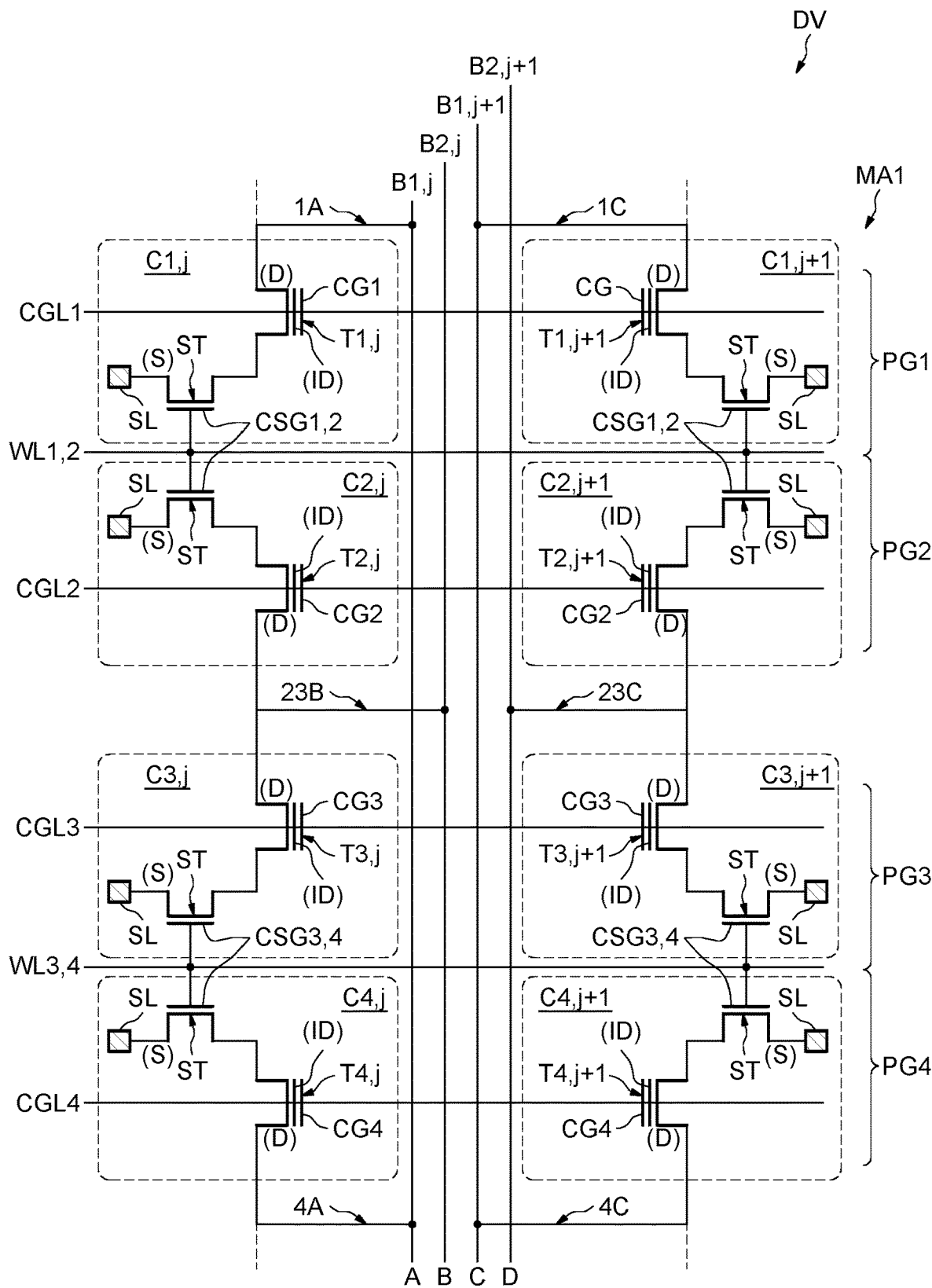

FIG. 2 is the electrical diagram of an embodiment of a memory plane MA1, produced in a semiconductor substrate. The memory plane comprises rows and columns of memory cells, eight memory cells C1,j, C2,j, C3,j, C4,j, C1,j+1, C2,j+1, C3,j+1, C4,j+1 being represented here. Each memory cell comprises a state transistor with trapping interface (ID), respectively referenced T1,j, T2,j, T3,j, T4,j, T1,j+1, T2,j+1, T3,j+1, T4,j+1, and a selection transistor ST connected between a source plane SL and the state transistor.

The memory cells C1,j, C2,j, C3,j, C4,j belong to a column of rank j and the memory cells C1,j+1, C2,j+1, C3,j+1, C4,j+1 belong to an adjacent column of rank j+1. The memory cells C1,j, C1,j+1 belong to a first row of memory cells, or physical page PG1, and their state transistors T1,j, T1,j+1 have control gates CG1 connected to a common gate drive line CGL1. The memory cells C2,j, C2,j+1 belong to a second row of memory cells, or physical page PG2, and their state transistors T2,j, T2,j+1 have control gates CG2 connected to a common gate drive line CGL2. The memory cells C3,j, C3,j+1 belong to a third row of memory cells, or physical page PG3, and their state transistors T3,j, T3,j+1 have control gates CG3 connected to a common gate drive line CGL3. The memory cells C4,j, C4,j+1 belong to a fourth row of memory cells, or physical page PG4, and their state transistors T4,j, T4,j+1 have control gates CG4 connected to a common gate drive line CGL4.

In the column of rank j, the memory cells C1,j, C2,j are twin memory cells and their selection transistors ST comprise a common selection gate CSG1,2 linked to a common word line WL1,2.

Likewise, the memory cells C3,j, C4,j are twin memory cells and their selection transistors ST comprise a common selection gate CSG3,4 linked to a common word line WL3,4.

In the column of rank j+1, the memory cells C1,j+1, C2,j+1 are twin memory cells and their selection transistors ST comprise a common selection gate CSG1,2 linked to the word line WL1,2.

The memory cells C3,j+1, C4,j+1 are twin memory cells and their selection transistors ST comprise a common selection gate CSG3,4 linked to the common word line WL3,4.

The common selection gates CSG1,2 or CSG3,4 of the pairs of twin memory cells are buried vertical gates produced in the form of conducting trenches made in the substrate, and the source terminals (S) of the selection transistors ST are linked to the buried source plane SL, extending under the region of the substrate where the memory cells are implanted.

The memory plane MA1 comprises two bit lines per column of memory cells. Thus, two bit lines B1,j, B2,j are allocated to the memory cells of the column of rank j, and two bit lines B1,j+1, B2,j+1 are allocated to the memory cells of the column of rank j+1.

Two twin memory cells are linked to different bit lines from among the two bit lines allocated to the column in which they are situated, while two adjacent but non-twin memory cells are linked to the same bit line.

Thus, in the column of rank j:
the drain terminal (D) of the state transistor T1,j is linked to the bit line B1,j by way of a conducting path 1A,
the drain terminal of the state transistor T2,j is linked to the bit line B2,j by way of a conducting path 23B,
the drain terminal of the state transistor T3,j is linked to the bit line B2,j by way of the conducting path 23B (the memory cell C2,j being adjacent but not twin to the memory cell C3,j), and
the drain terminal of the state transistor T4,j is linked to the bit line B1,j by way of a conducting path 4A.

In the column of rank j+1:
the drain terminal of the state transistor T1,j+1 is linked to the bit line B1,j+1 by way of a conducting path 1C,
the drain terminal of the state transistor T2,j+1 is linked to the bit line B2,j+1 by way of a conducting path 23D,
the drain terminal of the state transistor T3,j+1 is linked to the bit line B2,j+1 by way of the conducting path 23D (the memory cell C2,j+1 being adjacent but not twin to the memory cell C3,j+1), and
the drain terminal of the state transistor T4,j+1 is linked to the bit line B1,j+1 by way of a conducting path 4C.

Such a memory plane and twin memory cells structure is called a "dual bit line" structure.

Figure 3:
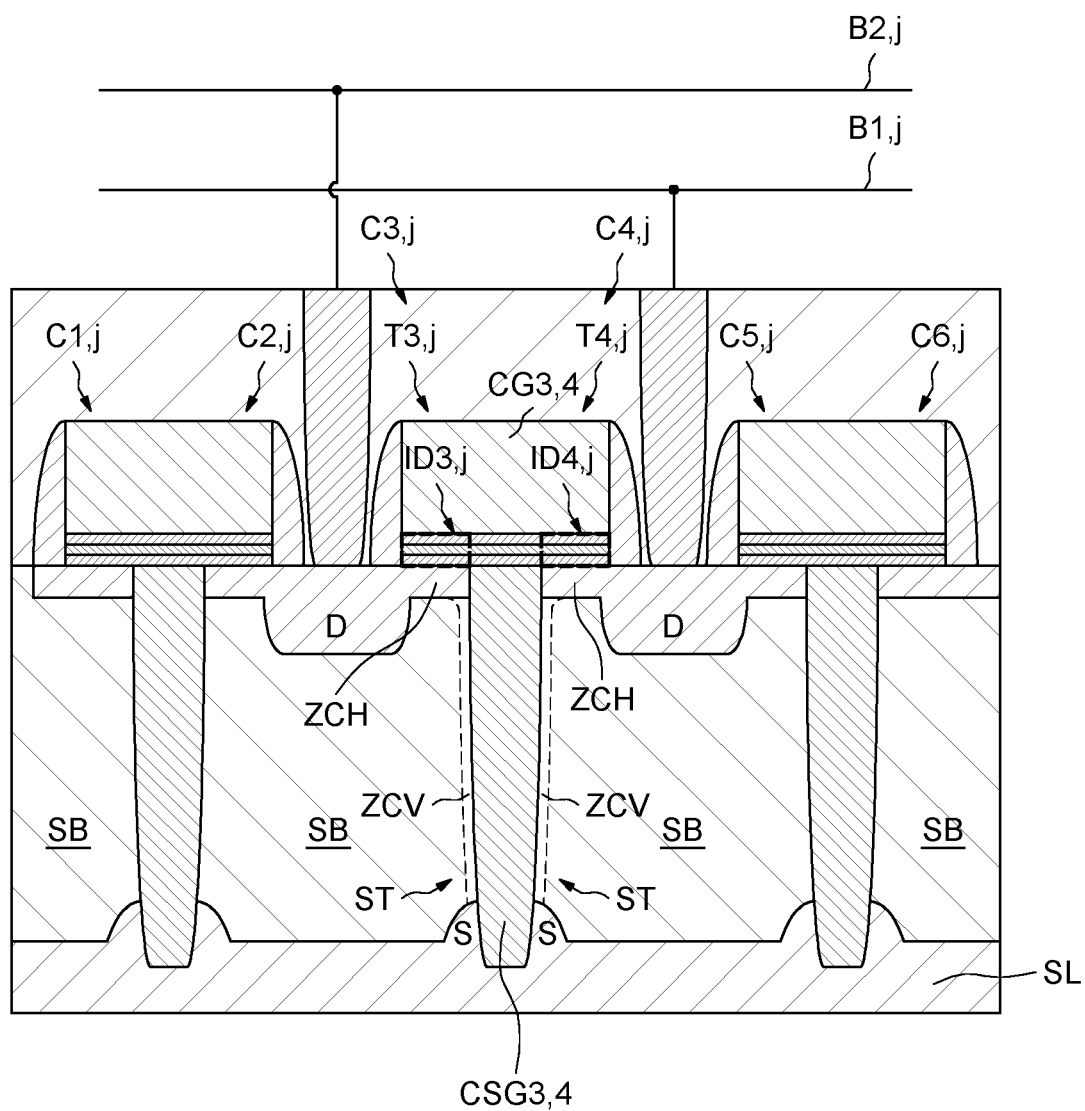

As illustrated in FIG. 3, each state transistor of a memory cell of the memory plane MA1 is preferably a depletion-type transistor of the type described with reference to FIG. 1, comprising an implanted channel ZCH. The selection transistors ST connected to the two state transistors T3,j and T4,j each have a vertical channel ZCV and a buried vertical common selection gate CSG3,4. Therefore as explained above the implantation of the channel ZCH of each state transistor T is not detrimental to the characteristics of each selection transistor. It should be noted that for the sake of simplification of the figure, the contact making it possible to link the buried common gate CSG3,4 to the corresponding word line is not represented.

Moreover, each memory cell can be read independently of its twin memory cell by means of the bit line to which it is linked and to which its twin memory cell is not linked. For example, after selection of the twin memory cells C3,j, C4,j by means of a selection voltage applied to the word line WL3,4, and after having applied a zero reading voltage to the gate drive line CGL3, the memory cell C3,j can be read by way of the bit line B2,j without it being necessary to apply a negative reading disabling voltage to the gate drive line CGL4 of the twin memory cell C4,j since this memory cell is not linked to the bit line B2,j but to the bit line B1,j.

Therefore it is possible to apply a zero reading voltage on the control gates of all the memory cells of the memory plane.

Figure 4:
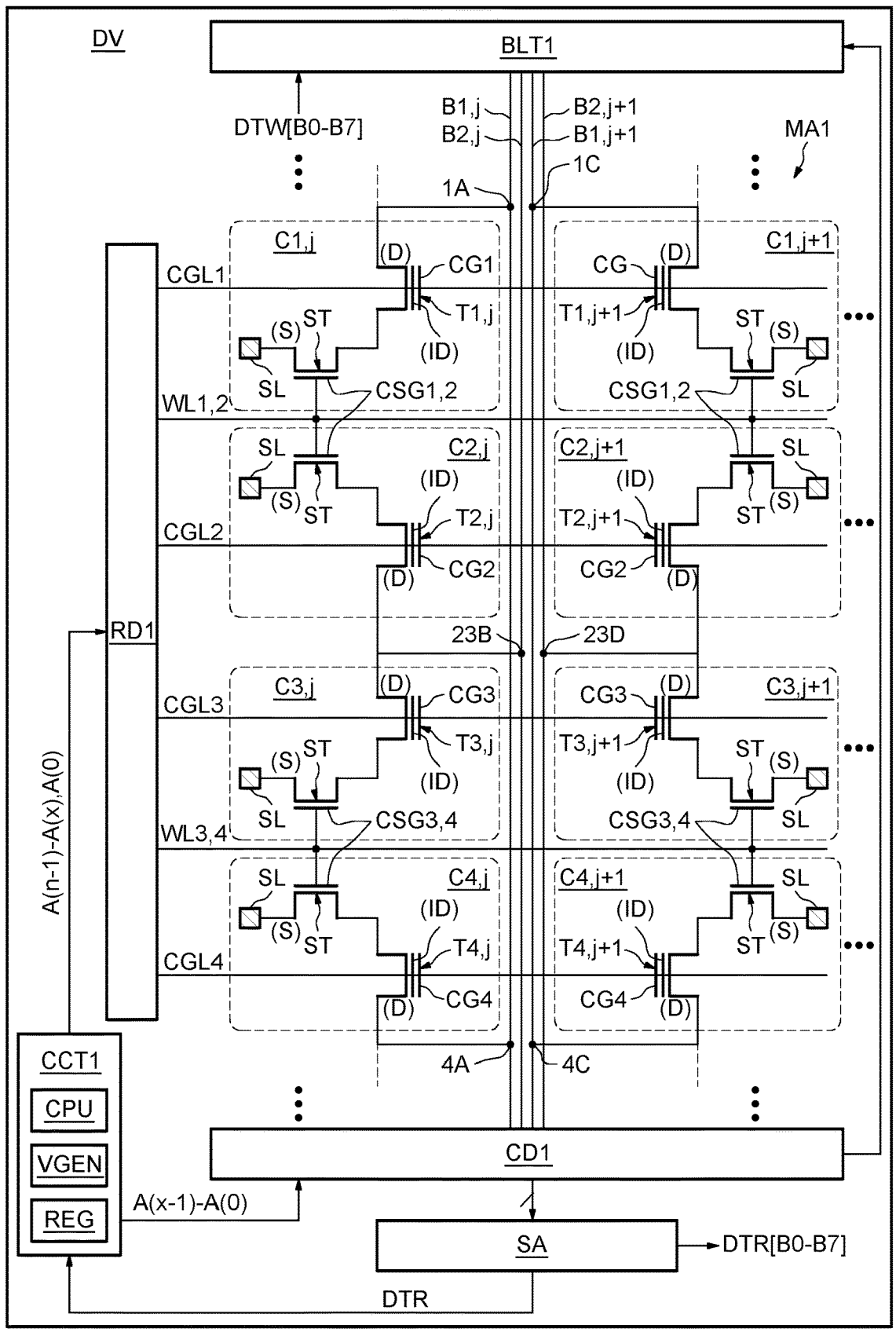

FIG. 4 is the electrical diagram of an integrated memory device DV comprising the memory plane MA1 of FIG. 2. The device DV comprises a drive circuit CCT1, a word line decoder RD1, a column decoder CD1, reading amplifiers SA equal in number to the number of bits of a word to be read in the memory plane, for example a word of eight bits B0-B7, and programming latches BLT1 for applying voltages to the bit lines B1,j, B2,j, B1,j+1, B2,j+1, as a function of a word DTW to be written in the memory, for example a word of eight bits B0-B7.

The word line decoder RD1 controls the voltages applied to the gate drive lines CGL1 to GL4 and to the word line WL1,2, WL2,3 as a function of a high-order address A(n−1)-A(x) of a word, or line address. The decoder CD1, in combination with the latches BLT1, controls the voltages applied to the bit lines B1,j, B2,j, B1,j+1, B2,j+1 as a function of a low-order address A(x−1)-A(0) of the word, or column address, the line and column addresses together forming the address A(n−1)-A0 of a word to be read or written in the memory plane. In read mode, the decoder CD1 links the reading amplifiers SA to the bit lines linked to the memory cells having to be read, and the reading amplifiers provide the word DTR.

The circuit CCT1 comprises for example a central unit CPU, a voltage generator VGEN, and address and data registers. It executes read or write commands, ensures the control of the decoders, the provision of the voltages necessary for the reading or writing operations (erasure-programming), the provision of the high-order and low-order addresses to the decoders, and if necessary executes a program for refreshing the memory cells.

Because of the presence of two bit lines per column, the word line decoder RD1 is configured to be able to separately control the voltages applied to the gate drive lines of twin memory cells, i.e. CGL1, CGL2 or CGL3, CGL3, which here have the same high-order address A(n−1)-A(x).

This separate control of the voltages can be reserved for the erasure operations, so as to apply a positive voltage to these memory cells situated on a page which is the twin of that containing the memory cell or cells undergoing erasure.

In read mode, the decoder can on the other hand, as indicated hereinabove, apply, by connecting them to earth, the same zero voltage to the twin gate drive lines or indeed to all the gate drive lines of the memory plane so as to reduce the "read stress" and limit the switchings of logic gates and therefore limit the electrical consumption of the memory, since the selection of the memory cells in read mode is ensured by means of the word lines WL.

In such an embodiment, the decoder RD1 receives, in addition to the high-order address A(n−1)-A(x) of a word, the lowest-order bit A(0) of the low-order address A(x−1)-A(0) of the word.

The decoder RD2 also receives from the circuit CCT1 an information signal which indicates to it whether the address decoding to be performed occurs within the framework of a read, of an erasure or of a programming of memory cells.

If the decoding occurs within the framework of an erasure, the decoder RD1 differentiates the two gate drive lines as a function of the bit A(0). For example, the decoder RD1 selects the gate drive line CGL1 if the bit line B1,j is designated by the complete address received by the memory, or selects the gate drive line CGL2 if the bit line B2,j is designated by the complete address received by the memory. In an equivalent variant, the decoder can receive a signal from the column decoder CD1 indicating to it which of the two gate drive lines must be selected. The person skilled in the art will naturally be able to provide for other embodiments of the decoder, aimed for example at separately controlling the voltages applied to the gate drive lines of twin memory cells in programming and erasure mode.

What is claimed is:

1. A memory device comprising:
   a first state transistor disposed at a surface of a semiconductor body;
   a second state transistor disposed at the surface of the semiconductor body, the first and second state transistors having a common control gate;
   a first selection transistor buried in the semiconductor body and coupled to the first state transistor so that current paths of the first selection transistor and first state transistor are coupled in series;
   a second selection transistor buried in the semiconductor body and coupled to the second state transistor so that current paths of the second selection transistor and second state transistor are coupled in series, the first and second selection transistors having a common buried selection gate;
   a dielectric region located between the common control gate and the semiconductor body;
   a first bit line coupled to the first state transistor, wherein the first bit line is further coupled to a third state transistor that has a control gate isolated from the common control gate; and
   a second bit line coupled to the second state transistor, wherein the second bit line is further coupled to a fourth state transistor that has a control gate isolated from the common control gate.

2. The memory device according to claim 1, wherein the dielectric region overlaps the common buried selection gate so as to form first and second charge-trapping dielectric interfaces on either side of the common buried selection gate.

3. The memory device according to claim 2, wherein the dielectric region located between the common control gate and the semiconductor body comprises a charge blocking layer that overlies a charge trapping layer that overlies a tunnel layer.

4. The memory device according to claim 1, wherein the current paths of the first selection transistor and first state transistor are coupled in series between a source line and the first bit line;

wherein the current paths of the second selection transistor and second state transistor are coupled in series between the source line and the second bit line; and wherein the common control gate is coupled to a gate drive line.

5. The memory device according to claim 1, wherein the first and second state transistors each comprise a channel at the surface in the semiconductor body, the channel being configured so that the first and second state transistors each operate in a depletion mode.

6. The memory device according to claim 5, wherein a dose of dopants of the channel lies between $10^{12}$ atoms/cm$^2$ and $10^{14}$ atoms/cm$^2$ and wherein a depth of the channel is less than or equal to 100 nm.

7. The memory device according to claim 1, wherein the first and second state transistors each have a first threshold voltage in a first logic state, a second threshold voltage in a second logic state, and a third threshold voltage in a virgin state, wherein the first threshold voltage is less than the third threshold voltage and the second threshold voltage is greater than the third threshold voltage.

8. The memory device according to claim 7, wherein the third threshold voltage lies between −1 volt and −0.5 volts.

9. The memory device according to claim 1, further comprising a buried source line, wherein the current path of the first selection transistor is coupled between the buried source line and the first state transistor and where in the current path of the second selection transistor is coupled between the buried source line and the second state transistor.

10. The memory device according to claim 9, wherein the semiconductor body is of conductivity type P and the buried source line is of conductivity type N.

11. A memory device, comprising:
a memory plane comprising rows and columns of non-volatile memory cells, the memory plane being disposed in a semiconductor substrate;
wherein each memory cell comprises a charge trapping dielectric interface and a state transistor selectable by a vertical selection transistor buried in the substrate and comprising a buried selection gate;
wherein the columns of the memory cells comprise pairs of twin memory cells, each pair including a first memory cell and a second memory cell;
wherein the buried selection gates of the selection transistors of the first and second memory cells of each pair constitute a common selection gate;
wherein the state transistors of the first and second memory cells of each pair have a common control gate;
wherein each column of the memory cells includes two bit lines;
wherein two twin adjacent memory cells of one and the same column are not linked to the same bit line;
wherein two non-twin adjacent memory cells of one and the same column are linked to the same bit line; and
wherein gate drive lines are linked to the common control gates of the state transistors of the memory cells of one and the same row.

12. The memory device according to claim 11, wherein each pair of twin memory cells include a dielectric region located between the common control gate and the semiconductor substrate, wherein the dielectric region of each pair of twin memory cells includes a charge trapping layer that overlies a tunnel layer and underlies a blocking layer.

13. The memory device according to claim 11, wherein the state transistor of each memory cell comprises a channel implanted at a surface in the semiconductor substrate, the channel being configured so that the memory cell operates in a depletion mode.

14. The memory device according to claim 11, further comprising a read circuit configured to apply a zero reading voltage on the common control gate during a read operation of the memory cell.

15. The memory device according to claim 14, wherein the read circuit is configured to apply a zero reading voltage on the common control gates of the state transistors of all the memory cells of the memory plane.

16. The memory device according to claim 14, further comprising a decoder coupled to the rows of the memory plane, wherein the decoder is coupled to receive a high-order address a word and the lowest-order bit of a low-order address of the word.

17. A memory device comprising:
a semiconductor body having an upper surface;
a buried region spaced from the upper surface;
a conductive trench vertically extending from the upper surface to the buried region;
a dielectric layer surrounding the conductive trench to isolate the conductive trench from the semiconductor body between the upper surface and the buried region;
a first doped region formed at the upper surface adjacent a first side of the conductive trench;
a second doped region formed at the upper surface adjacent a second side of the conductive trench;
a charge trapping layer overlying the upper surface, the charge trapping layer disposed over the conductive trench and laterally extending over the upper surface toward the first doped region and toward the second doped region; and
a conductive gate region overlying the charge trapping layer.

18. The memory device according to claim 17 wherein:
a first state transistor that includes the first doped region, a first portion of the charge trapping layer, and the conductive gate region;
a second state transistor that includes the second doped region, a second portion of the charge trapping layer, and the conductive gate region;
a first selection transistor; and
a second selection transistor, the conductive trench serving as a gate region for both the first selection transistor and the second selection transistor.

19. The memory device according to claim 18, wherein the first and second state transistors each comprise a channel doped at the upper surface in the semiconductor body, the channel being configured so that the first and second state transistors each operate in a depletion mode.

20. The memory device according to claim 18, wherein the first and second transistors each have a first threshold voltage in a first logic state, a second threshold voltage in a second logic state, and a third threshold voltage in a virgin state, wherein the first threshold voltage is less than the third threshold voltage and the second threshold voltage is greater than the third threshold voltage.

* * * * *